United States Patent [19]
Lee et al.

[11] Patent Number: 5,767,583
[45] Date of Patent: Jun. 16, 1998

[54] SEMICONDUCTOR CHIP I/O AND POWER PIN ARRANGEMENT

[75] Inventors: Jae Jin Lee; Jung Pil Kim, both of Kyoungki-do, Rep. of Korea

[73] Assignee: Hyundai Electronics Industries, Inc., Kyoungki-do, Rep. of Korea

[21] Appl. No.: 906,005

[22] Filed: Aug. 4, 1997

Related U.S. Application Data

[63] Continuation of Ser. No. 431,429, May 1, 1995, abandoned.
[51] Int. Cl.$^6$ ........................................... H01L 23/48
[52] U.S. Cl. ........................... 257/786; 257/691; 257/773
[58] Field of Search ................................ 257/691, 773, 257/786, 923

[56] References Cited

U.S. PATENT DOCUMENTS 5,473,198  12/1995  Hagiya et al. ............................ 257/786

FOREIGN PATENT DOCUMENTS 5-243492  9/1993  Japan ........................................ 257/786

*Primary Examiner*—Jerome Jackson
*Assistant Examiner*—John Guay
*Attorney, Agent, or Firm*—Townsend and Townsend and Crew LLP

[57] ABSTRACT

A semiconductor device including outer pins including power pins adapted to supply a source voltage or a ground voltage, data pins adapted to input and output data and classified into a plurality of data pin groups having the same number of data pins, and output voltage pins adapted to supply output voltages of data pins of the data pin groups respectively associated therewith, wherein each of the output voltage pins is arranged between a pair of sub-groups constituting one of the data pin groups associated therewith, thereby capable of minimizing a resistance generated between each output voltage pin and each of data pins driven by the output voltage pin and achieving an improvement in data output characteristic.

7 Claims, 12 Drawing Sheets

SEMICONDUCTOR CHIP I/O AND POWER PIN ARRANGEMENT

This is a Continuation of application No. 08/431,429 filed Mar. 1, 1995 now abandoned, the disclosure of which is incorporated by reference.

BACKGROUND OF THE INVENTION

1. Field of the Invention

The present invention relates to a semiconductor device, and more particularly to a semiconductor device having a pin arrangement including output voltage pins classified into two groups respectively having a source voltage outputting function a ground voltage outputting function and data pins associated with the output voltage pins and driven by the associated output voltage pins.

2. Description of the Prior Art

Generally, semiconductor devices with an increased integration degree require a large number of data pins in order to input and output a large amount of data in a simultaneous manner. In particular, inputting and outputting of data should be carried out at a high speed. Such requirements has led use of power supply pins each adapted to drive only one of data pin groups each including a given number of data pins.

However, this technique involves a problem that when a large amount of current flows instantaneously as a large amount of data is inputted and outputted in a short time, a severe noise occurs at output source voltage pins or output ground voltage pins due to a resistance or capacitance at the output source voltage pins or output ground voltage pins.

FIGS. 1 to 3 illustrate different arrangements of pads coupled to outer pins, respectively. The arrangements of FIGS. 1 to 3 are adapted to compare characteristics respectively obtained by the conventional pin arrangement and the pin arrangement in accordance with the present invention, with each other.

FIG. 1 illustrates a conventional arrangement of pads coupled to outer pins in a semiconductor device. In the arrangement shown in FIG. 1, pads 3 are arranged along each longitudinal edge of a chip. The pads 3 are connected respectively to a variety of pins including a source voltage pin, data input/output pins, output source voltage pins and output ground voltage pins, by means of lead wires 2. FIG. 2 illustrates another conventional arrangement of pads adapted to provide a lead-on-chip (LOC) package. In this case, pads are arranged in the form of a single row along a longitudinally-extending central portion of a chip, thereby constructing a single row type pad arrangement. To the pads, pins are coupled by means of lead wires transversely extending on the chip, respectively. On the other hand, FIG. 3 illustrates another conventional arrangement of pads adapted to provide an LOC package similar to that of FIG. 2. In the case shown in FIG. 3, pads are arranged in the form of two rows along a central portion of a chip, thereby constructing a double row type pad arrangement.

FIG. 4 illustrates a conventional pin arrangement in an integrated circuit. The pin arrangement shown in FIG. 4 includes a variety of pins, that is, a source voltage pin vcc, a ground voltage pin vss, data input/output pins dq1, ... dq15, output source voltage pins vccq and output ground voltage pins vssq. In the illustrated pin arrangement, the output source voltage pins vccq and the output ground voltage pins vssq are alternatingly arranged for every two data input/output pins.

FIGS. 5a to 5c illustrate different connections of pads in the integrated circuit of FIG. 4, respectively. As shown in FIGS. 5a to 5c, these connections axe modelled using resistor components r connected among data pads do,... dn, output ground voltage pads vssq and output source voltage pads vccq.

The pin arrangement of FIG. 4 is a double row pin arrangement including two symmetrical pin rows respectively arranged along longitudinally-extending opposite edges of the packaged chip. One of the pin rows includes the source voltage pin voc adapted to supply a source voltage to drive the entire inner circuit of the chip and arranged at one longitudinal end of the chip and a plurality of pin groups following the source voltage pin vcc. The other pin row includes the ground voltage pin vss arranged at the one longitudinal end of the chip and a plurality of pin groups following the ground voltage pin vss. Each pin group arranged along each edge of the chip includes two data input/output pins, one output voltage pin, another two data input/output pins and another output voltage pin arranged in this order. The output voltage pins in each pin group include the output source voltage pin vccq and the output ground voltage pin vssq alternatingly arranged for every two input/output pins. In the illustrated case, for example, the first pin group following the source voltage pin vcc includes two data input/output pins dq0 and dq1, an output ground voltage pin vssq, two data input/output pins dq2 and dq3 and an output source voltage pin vccq whereas the first pin group following the ground voltage pin vss includes two data input/output pins dqlS and dql4, an output ground voltage pin vssq, two data input/output pins dq13 and dq12 and an output source voltage pin vccq.

FIG. 5a shows a connecting arrangement wherein pins having the arrangement of FIG. 4 are connected to pads arranged along each edge of a chip. In this case, the chip has the same structure at opposite sides thereof. The arrangement of FIG. 5a is modelled on the basis of resistor components r of output source voltage pin and output ground generating between pads connected to each other. In this arrangement, the area where a highest voltage drop occurs due to a resistance generated on a voltage supply line in the chip is the data pad d0 which is coupled to the output ground voltage pad vssg via a resistor of 2r and to the output source voltage pad vccq, connected to the external, via a resistor of 5r. On the other hand, the area where a lowest voltage drop occurs is the data pad d3 which is coupled to the output ground voltage pad vssc via a resistor of 2r and to the output source voltage pad vccq via a resistor of r. Upon outputting data of a high voltage level at data pins in this arrangement, accordingly, the data is very slowly transferred to the data input/output pin dq0 while being very rapidly transferred to the data input/output pin dq3. Undesirably, the arrangement of FIG. 5a exhibits a very large output speed difference.

FIG. 5b shows a connecting arrangement wherein pins having the arrangement of FIG. 4 are connected to pads arranged in the form of a single row along a central portion of a chip as in FIG. 2. In this case, the pins arranged at one edge of the chip and the pins arranged at the other edge of the chip are alternatingly coupled one by one to the pads arranged in the form of the single row. In this arrangement, the area where a highest voltage drop occurs due to a resistance generated on a voltage supply line in the chip is the data pad d0, as in the case of FIG. 5a. The data pad d0 is coupled to the output ground voltage pad vssq via a resistor of 4r and to the output source voltage pad vccq via a resistor of 10r. On the other hand, the area where a lowest voltage drop occurs is the data pad d12 which is coupled to the output ground voltage pad vssq via a resistor of 4r and to the output source voltage pad vccq via a resistor of r. Upon outputting data of a high voltage level at data pins in this arrangement, accordingly, the data is very slowly transferred to the data pad d0 while being very rapidly transferred to the data pad d12.

FIG. 5c shows a connecting arrangement wherein pins having the arrangement of FIG. 4 are connected to pads arranged in the form of a double row along a central portion of a chip as in FIG. 3. This arrangement has the same structure at opposite sides of the chip and exhibits a characteristic similar to that of FIG. 5a.

As apparent from the above description made in conjunction with FIGS. 5a to 5c, the conventional pin arrangements involve a great resistance difference between the pin outputting data at a highest speed and the pin outputting data at a lowest speed. Where narrow voltage supply lines are used or where a large amount of current is consumed, such a great resistance difference may result in a great output time difference between data to be simultaneously outputted, due to a voltage drop generated on the voltage supply lines.

SUMMARY OF THE INVENTION

Therefore, an object of the invention is to provide a semiconductor device capable of minimizing a voltage drop caused by a resistance generated at its output source voltage pin adapted to supply an output voltage to data output terminals and at its output ground voltage pin, thereby obtaining a stable output voltage and improving the rate of transferring data to the data output terminals.

In accordance with one aspect, the present invention provides a semiconductor device comprising outer pins including power pins adapted to supply a source voltage or a ground voltage, data pins adapted to input and output data and classified into a plurality of data pin groups having the same number of data pins, and output voltage pins adapted to supply output voltages of data pins of the data pin groups respectively associated therewith, wherein each of the output voltage pins is arranged between a pair of sub-groups constituting one of the data pin groups associated therewith.

In accordance with another aspect, the present invention provides a semiconductor device comprising outer pins and pad terminals each connected to associated ones of the outer pins, the pad terminals including power pads adapted to supply a source voltage or a ground voltage to an inner structure of the semiconductor device, data pads adapted to input and output data and classified into a plurality of data pad groups having the same number of data pads, and output voltage pads adapted to supply output voltages of data pads of the data pad groups respectively associated therewith, wherein each of the output voltage pads is arranged between a pair of sub-groups constituting one of the data pad groups associated therewith.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 6:
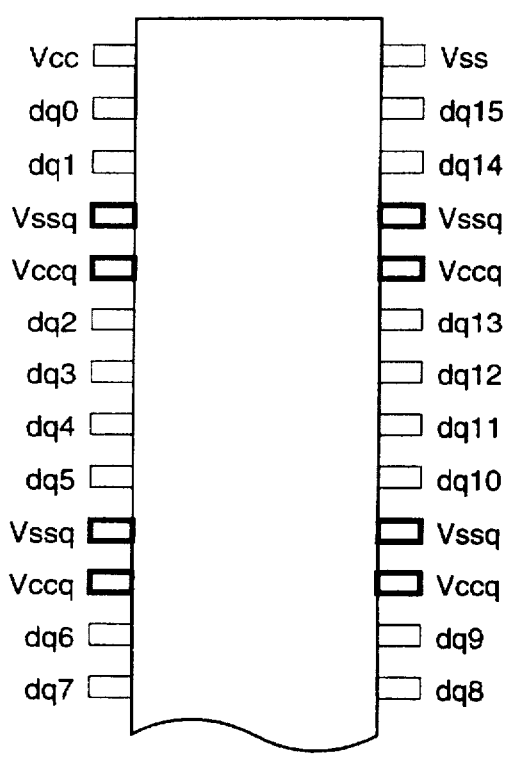
FIG. 6 is a view illustrating a pin arrangement in a semiconductor device in accordance with a first embodiment of the present invention.

FIG. 6 is a view illustrating a pin arrangement in a semiconductor device in accordance with a first embodiment of the present invention. The pin arrangement shown in FIG. 6 includes two symmetrical pin rows respectively arranged along longitudinally-extending opposite edges of a chip constituting the semiconductor device. One of the pin rows includes a source voltage pin vcc arranged at one longitudinal end of a chip constituting the semiconductor device and a plurality of pin groups following the source voltage pin vcc. The other pin row includes the ground voltage pin vss arranged at the one longitudinal end of the chip and a plurality of pin groups following the ground voltage pin vss. Each pin group arranged along each edge of the chip includes two pairs of data input/output pins and a pair of output voltage pins arranged in series between the data input/output pin pairs. The output voltage pin pair includes an output ground voltage pin vssq and an output source voltage pin vccq. In the illustrated case, for example, the first pin group following the source voltage pin vcc includes a pair of data input/output pins dq0 and dq1, another pair of data input/output pins dq2 and dq3, and a pair of output voltage pins vssq and vccq.

Figure 7A:
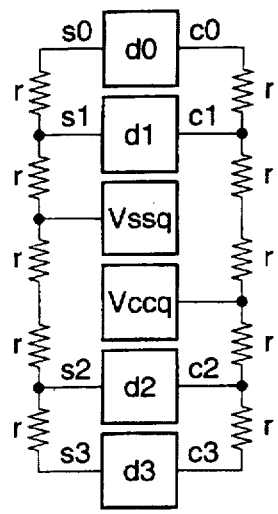
FIGS. 7a to 7c are views respectively illustrating different connection models of pads connected to pins having the pin arrangement of FIG. 6.
Figure 7B:
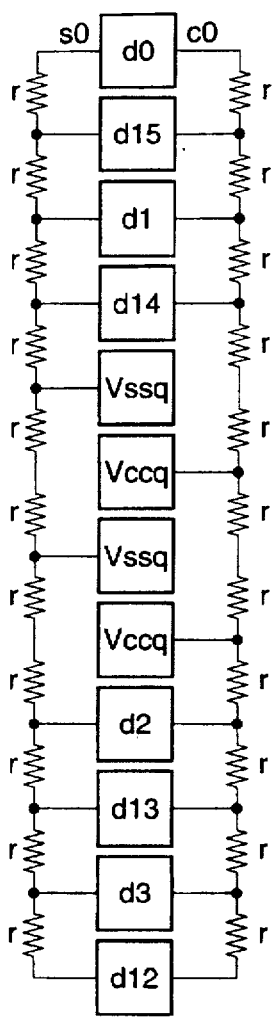
Figure 7C:
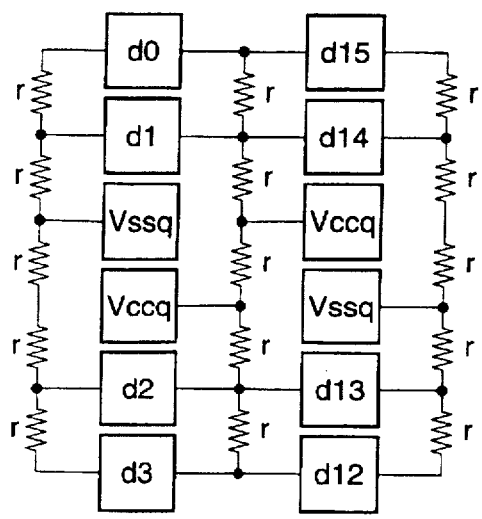

FIGS. 7a to 7c illustrate different connections of data pins to power pins in the pin arrangement of FIG. 6, respectively.

As shown in FIGS. 7a to 7c, these connections are modelled using resistor components.

FIG. 7a shows a connecting arrangement wherein pins having the arrangement of FIG. 6 are connected to pads arranged along each edge of the chip. In this case, the chip has the same structure at opposite sides thereof. In this arrangement, the area where a highest voltage drop occurs due to a resistance generated on a voltage supply line in the semiconductor device is the data pad d0 which is coupled to the output ground voltage pad vssq via a resistor of 2r and to the output source voltage pad vccq via a resistor of 3r. On the other hand, the area where a lowest voltage drop occurs is the data pad d2 which is coupled to the output ground voltage pad vssg via a resistor of 2r and to the output source voltage pad vccq via a resistor of r. As a result, the resistance difference between the pad exhibiting the highest voltage drop and the pad exhibiting the lowest voltage drop is small, as compared to conventional cases. Upon outputting data of a high voltage level, accordingly, the data pads d0 and d2 exhibit about the same data output speed.

Figure 2:
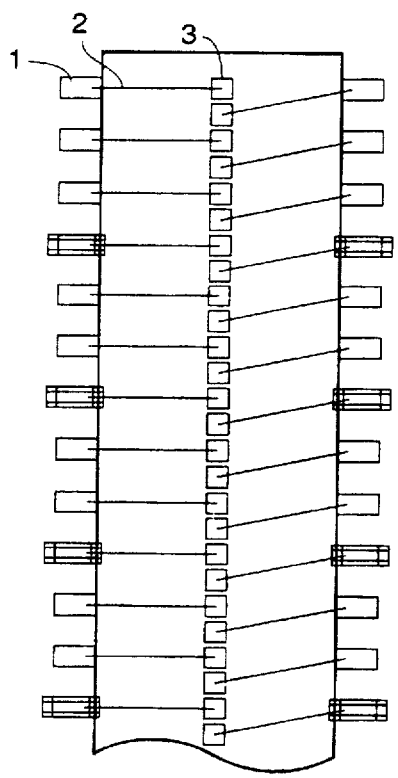
FIG. 2 is a view illustrating another example of a pad arrangement employed in conventional semiconductor devices.

FIG. 7b shows a connecting arrangement wherein pins having the arrangement of FIG. 6 are connected to pads arranged in the form of a single row along the central portion of the chip as in FIG. 2. In this case, the pins arranged at one edge of the chip and the pins arranged at the other edge of the chip are alternatingly coupled one by one to the pads arranged in the form of the single row. In this arrangement, the area where a highest voltage drop occurs due to a resistance generated on a voltage supply line in the chip is the data pad d0 which is coupled to the output ground voltage pad vssq via a resistor of 4r and to the output source voltage pad vcc via a resistor of 5r. On the other hand, the area where a lowest voltage drop occurs is the data pad d2 which is coupled to the output ground voltage pad vssq via a resistor of 2r and to the output source voltage pad vccq via a resistor of r. Since the resistance difference between the pad exhibiting the highest voltage drop and the pad exhibiting the lowest voltage drop is small as compared to conventional cases, the data output speed difference between the data pads d0 and d2 upon outputting data of a high voltage level is correspondingly reduced.

Figure 3:
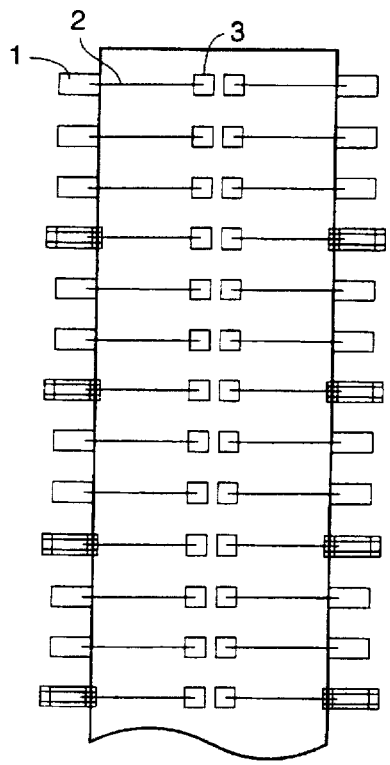
FIG. 3 is a view illustrating another example of a pad arrangement employed in conventional semiconductor devices.
Figure 4:
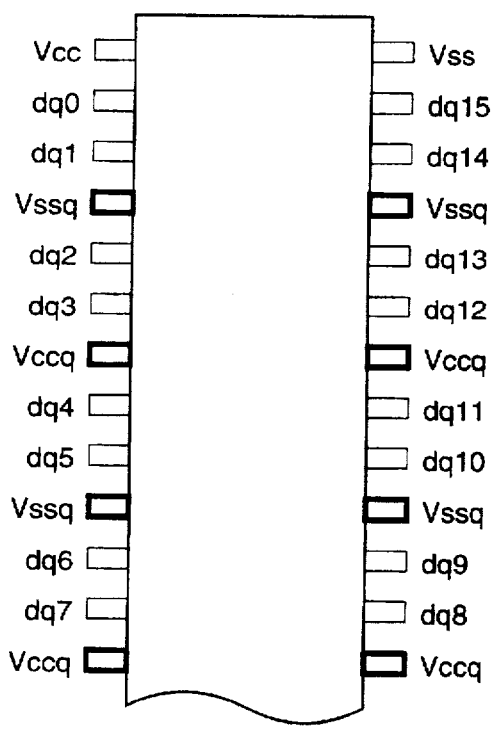
FIG. 4 is a view illustrating an example of a pin arrangement employed in conventional semiconductor devices.
Figure 5A:
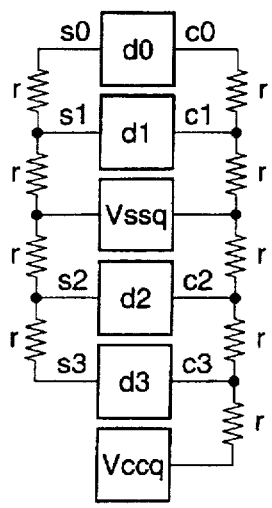
FIGS. 5a to 5c are views respectively illustrating different connection models of pads connected to pins having the pin arrangement of FIG. 4.
Figure 5B:
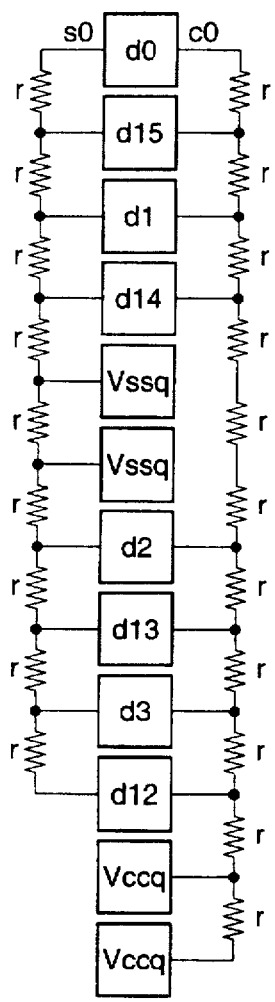
Figure 5C:
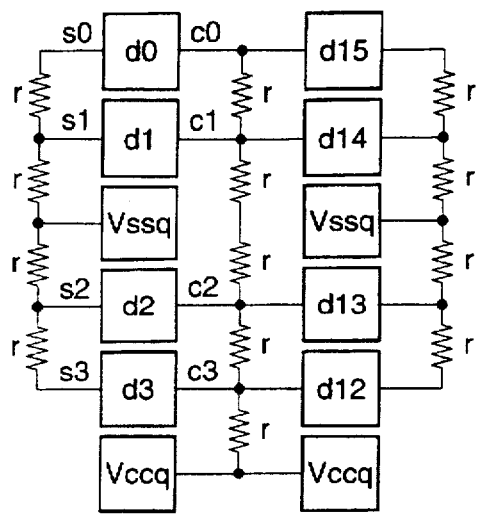

FIG. 7c shows a connecting arrangement wherein pins having the arrangement of FIG. 4 are connected to pads arranged in the form of a double row along the central portion of the chip as in FIG. 3. This arrangement has the same structure at opposite sides of the chip and exhibits the same characteristic as that of FIG. 7a.

Figure 8:
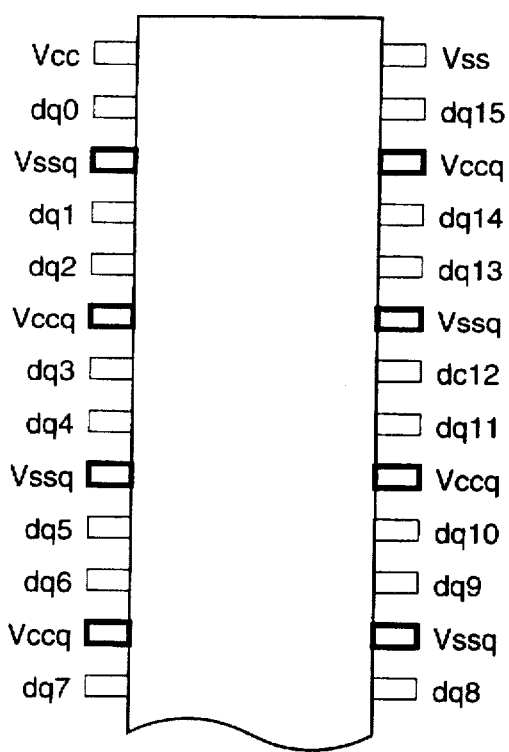
FIG. 8 is a view illustrating a pin arrangement in a semiconductor device in accordance with a second embodiment of the present invention.

FIG. 8 is a view illustrating a pin arrangement in a semiconductor device in accordance with a second embodiment of the present invention. The pin arrangement of FIG. 8 has the same structure as that of FIG. 6 except for the pin arrangement of each pin group. Each pin group arranged along each edge of the chip includes two pairs of data input/output pins and a pair of output voltage pins each arranged between each data input/output pin pair. The output voltage pin pair includes an output ground voltage pin vssq and an output source voltage pin vccg. Corresponding pin groups respectively arranged along opposite edges of the chip have the same pin arrangement except that they have opposite arrangements of output voltage pins vssq and vccq. In the illustrated case, for example, the first pin group following the source voltage pin vcc includes a pair of data input/output pins dq0 and dq1, an output ground voltage pin vssq arranged between the pins dq0 and dq1, another pair of data input/output pins dq2 and dq3, and an output source voltage pin vccq arranged between the pins dq2 and dq3, all the pins being arranged in the order of dq0, vssq, dq1, dq2, vccq and dq3. On the other hand, the first pin group following the ground voltage pin vss includes a pair of data input/output pins dq15 and dg14, an output source voltage pin vccq arranged between the pins dq15 and dq14, another pair of data input/output pins dq13 and dq12, and an output ground voltage pin vssq arranged between the pins dq13 and dq12, all the pins being arranged in the order of dq15, vccq, dq14, dq13, vssq and dq12.

Figure 9A:
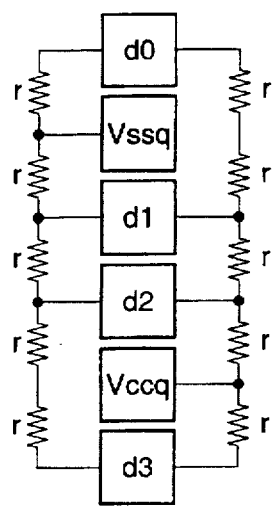
FIGS. 9a to 9c axe views respectively illustrating different connection models of pads connected to pins having the pin arrangement of FIG. 8.
Figure 9B:
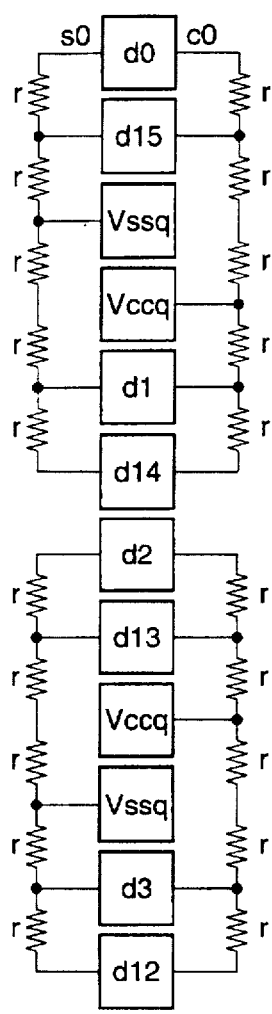
Figure 9C:
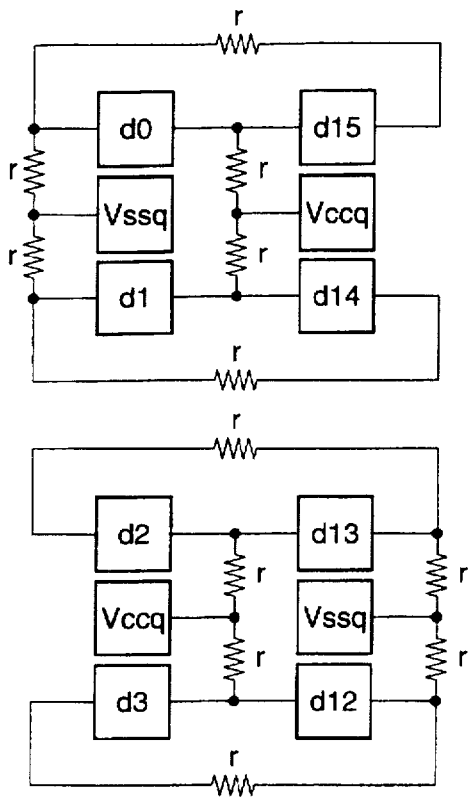

FIGS. 9a to 9c illustrate different connections of data pins to power pins in the pin arrangement of FIG. 8, respectively. As shown in FIGS. 9a to 9c, these connections are modelled using resistor components.

FIG. 9a shows a connecting arrangement wherein pins having the arrangement of FIG. 8 are connected to pads arranged along each edge of the chip. In this case, the chip has the same structure at opposite sides thereof. In this arrangement, the area where a highest voltage drop occurs due to a resistance generated on a voltage supply line in the semiconductor device is the data pad d0 which is coupled to the output ground voltage pad vssq via a resistor of r and to the output source voltage pad vccq via a resistor of 4r. On the other hand, the area where a lowest voltage drop occurs is the data pad d2 which is coupled to the output ground voltage pad vssq via a resistor of 2r and to the output source voltage pad vccq via a resistor of r. Since the resistance difference between the pad exhibiting the highest voltage drop and the pad exhibiting the lowest voltage drop is small as compared to conventional cases, the data output speed difference between the data pads d0 and d2 upon outputting data of a high voltage level is correspondingly reduced.

FIG. 9b shows a connecting arrangement wherein pins having the arrangement of FIG. 8 are connected to pads arranged in the form of a single row along the central portion of the chip as in FIG. 2. In this case, the pins arranged at one edge of the chip and the pins arranged at the other edge of the chip are alternatingly coupled one by one to the pads arranged in the form of the single row. In this arrangement, the area where a highest voltage drop occurs due to a resistance generated on a voltage supply line in the chip is the data pad d0 which is coupled to the output ground voltage pad vssq via a resistor of 2r and to the output source voltage pad vccq via a resistor of 3r. On the other hand, the area where a lowest voltage drop occurs is the data pad d1 which is coupled to the output ground voltage pad vssq via a resistor of 2r and to the output source voltage pad vccq via a resistor of r. Since the resistance difference between the pad exhibiting the highest voltage drop and the pad exhibiting the lowest voltage drop is small as compared to conventional cases, the data output speed difference between the data pads d0 and d1 upon outputting data of a high voltage level is correspondingly reduced.

FIG. 9c shows a connecting arrangement wherein pins having the arrangement of FIG. 8 are connected to pads arranged in the form of a double row along the central portion of the chip as in FIG. 3. In this arrangement, data pads dpn are connected to the output source voltage pad vccq respectively by resistors having the same resistance. As a result, there is little difference among data pins upon outputting data of a high voltage level. Although a resistance difference occurs among data pins upon outputting data of a low voltage level, it has no effect on the data output speed because it is very small.

Figure 10:
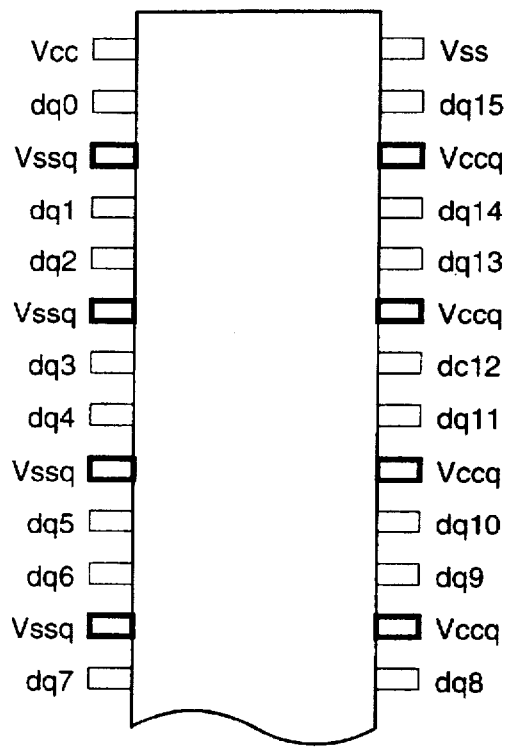
FIG. 10 is a view illustrating a pin arrangement in a semiconductor device in accordance with a third embodiment of the present invention.

FIG. 10 is a view illustrating a pin arrangement in a semiconductor device in accordance with a third embodiment of the present invention adapted to improve the chip characteristic of the LOC package structure. The pin arrangement of FIG. 10 is the same as that of FIG. 8 except that each output voltage pin of each pin group arranged one edge of the chip is the output ground voltage pin vssq whereas each output voltage pin of each pin group arranged the other edge of the chip is the output source voltage pin vccq.

Figure 11A:
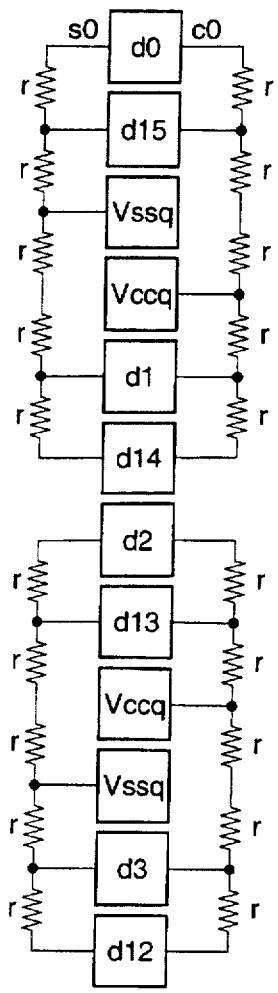
FIGS. 11a and 11b are views respectively illustrating different connection models of pads connected to pins having the pin arrangement of FIG. 10.
Figure 11B:
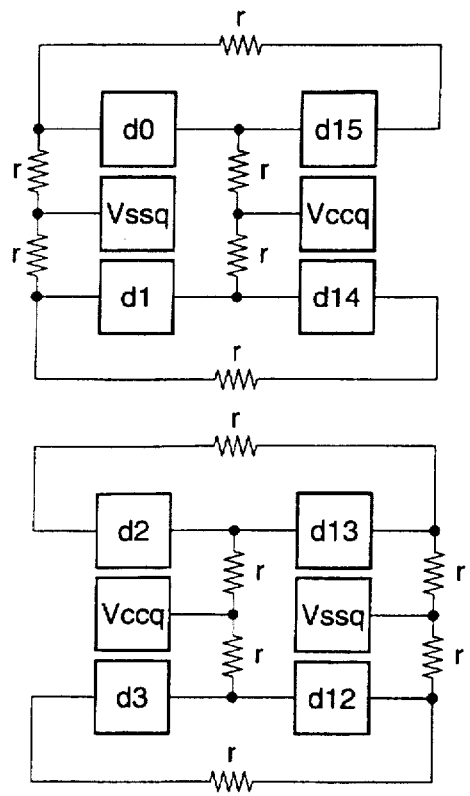

FIGS. 11a and 11b illustrate different connections of data pins to power pins in the pin arrangement of FIG. 10, respectively. As shown in FIGS. 11a and 11b, these connections are modelled using resistor components. Since the arrangements of FIGS. 11a and 11b are the same as those of FIGS. 9b and 9c, respectively, they have characteristics respectively identical to those of FIGS. 9b and 9c.

It should be noted that the pin arrangement of FIG. 10 can be used only for the LOC type pad arrangement shown in FIG. 2 or FIG. 3.

Figure 12:
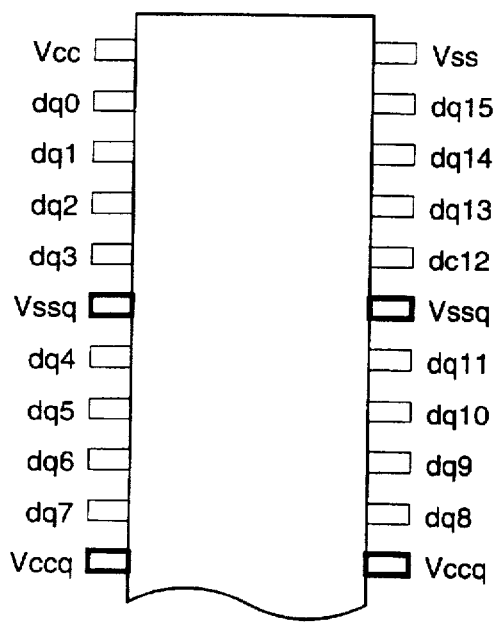
FIG. 12 is a view illustrating another example of a pin arrangement employed in conventional semiconductor devices.

FIG. 12 is a view illustrating another conventional pin arrangement. This pin arrangement is obtained by expanding the pin arrangement of FIG. 4 such that eight data pins are driven by a pair of output voltage pins, namely, one output source voltage pin vccq and one output ground voltage pin vssq. The pin arrangement of FIG. 12 has a similar characteristic to that of FIG. 4.

Figure 13:
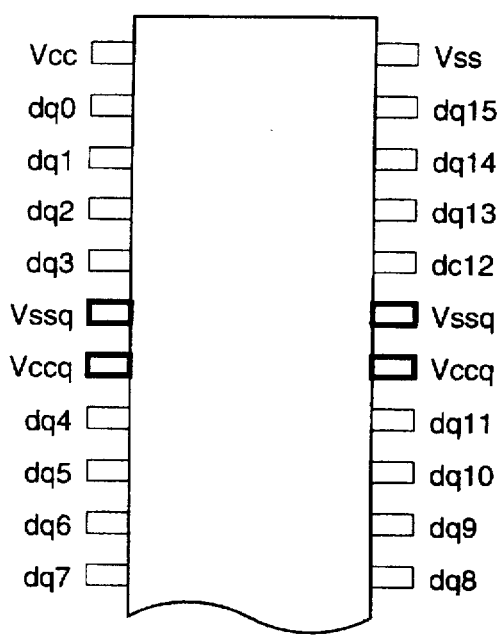
FIG. 13 is a view illustrating a pin arrangement in a semiconductor device in accordance with a fourth embodiment of the present invention.
Figure 14:
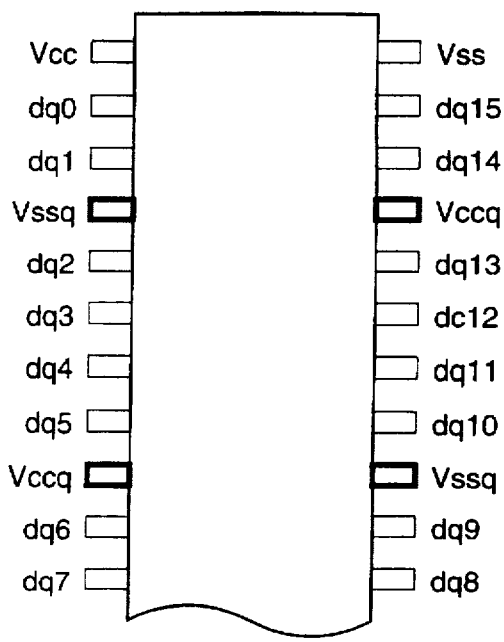
FIG. 14 is a view illustrating a pin arrangement in a semiconductor device in accordance with a fifth embodiment of the present invention.
Figure 15:
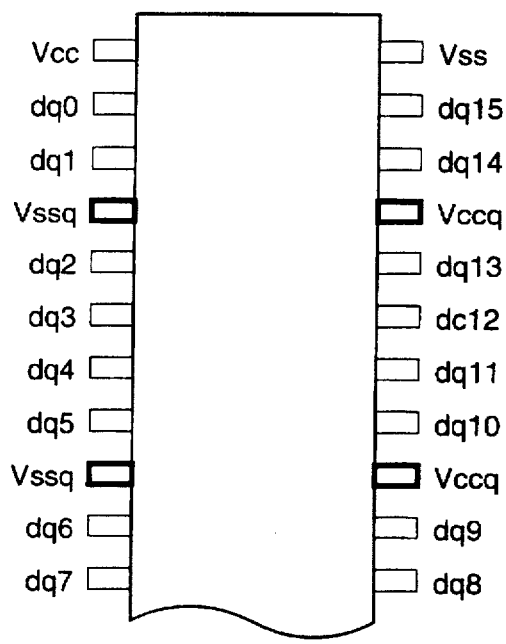
FIG. 15 is a view illustrating a pin arrangement in a semiconductor device in accordance with a sixth embodiment of the present invention.

FIGS. 13 to 15 illustrate pin arrangements respectively in accordance with another embodiments of the present invention. The pin arrangements of FIGS. 13 to 15 are obtained by respectively expanding the pin arrangements of FIG. 6, FIG. 8 and FIG. 10 such that eight data pins are driven by a pair of output voltage pins. The pin arrangements of FIGS. 13 to 15 have characteristics respectively similar to those of FIG. 6, FIG. 8 and FIG. 10. Since each of the pin arrangements of FIGS. 13 to 15 involves a small resistance difference among data pins as compared to the pin arrangement of FIG. 12, it exhibits a high data output speed while generating a reduced noise.

Figure 16:
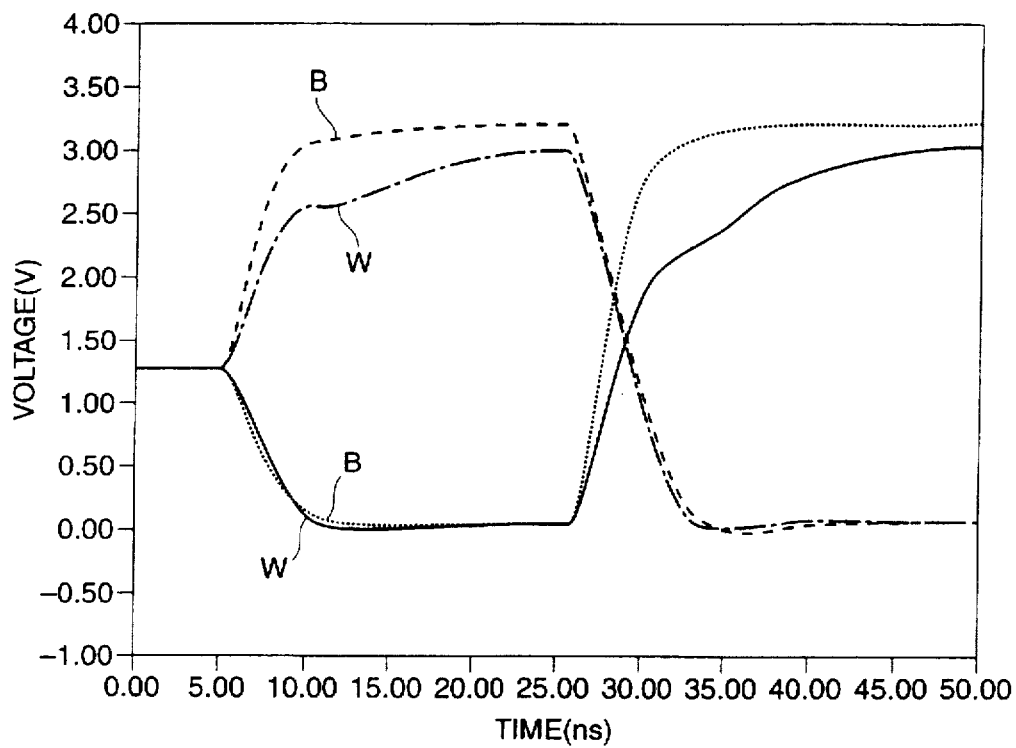
FIGS. 16 and 17 are simulation diagrams of data output results respectively obtained by the prior art and the present invention under the same condition.
Figure 17:
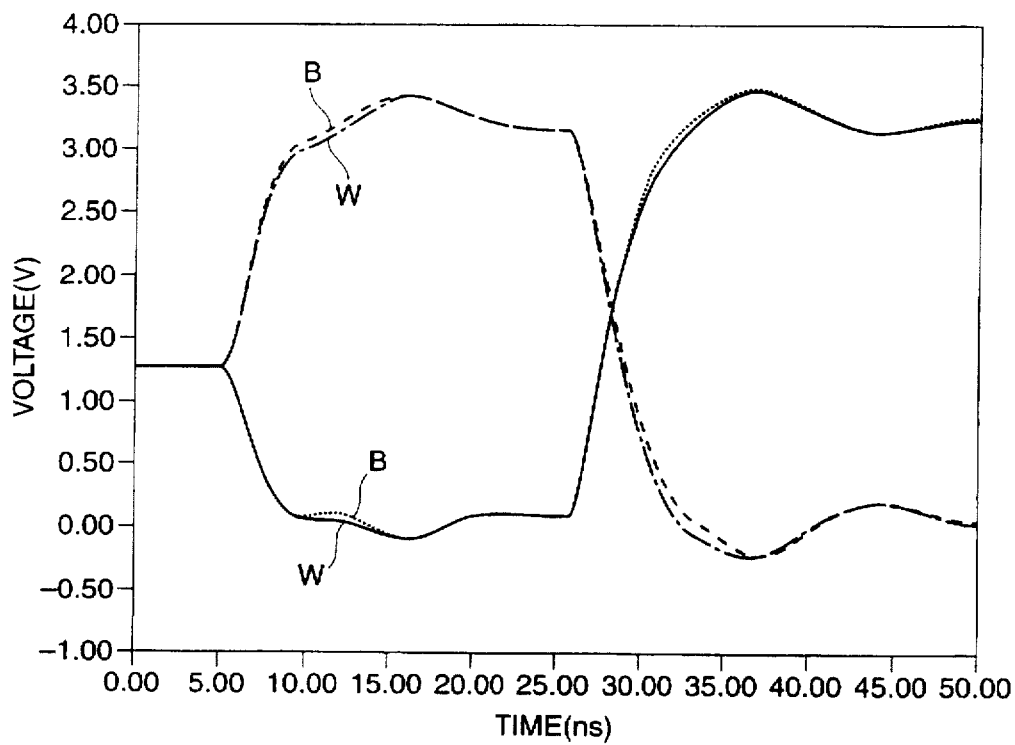

FIGS. 16 and 17 are simulation diagrams of data output results respectively obtained by the prior art and the present invention under the same condition. By referring to FIGS. 16 and 17, it can be found that the present invention obtains a data output speed improved over that of the prior art in both the case of outputting data of a low voltage level and the case of outputting data of a high voltage level under the best operating condition of the chip or under the worst operating condition of the chip.

The resistance value existing between the output source voltage pin vccq and the worst data pin in each of the pin arrangements in accordance with the above-mentioned embodiments of the present invention is expressed in the following Table 1 on the basis of the resistance r between neighboring pads.

TABLE 1

Figure 1:
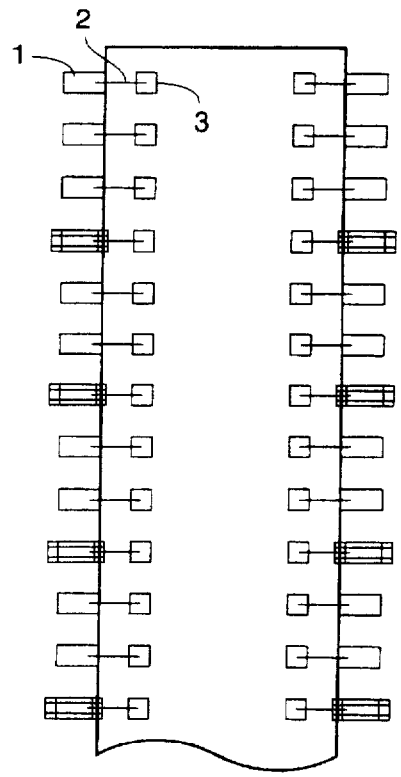
FIG. 1 is a view illustrating an example of a pad arrangement employed in conventional semiconductor devices.

|  | Type of FIG. 1 | Type of FIG. 2 | Type of FIG. 3 |
| --- | --- | --- | --- |
| FIG. 4 | 5r | 10r | 5r |
| FIG. 6 | 3r | 5r | 3r |
| FIG. 8 | 4r | 3r | 2r |
| FIG. 10 | 0 | 3r | 2r |
| FIG. 12 | 9r | 18r | 9r |
| FIG. 13 | 5r | 10r | 5r |
| FIG. 14 | 7r | 6r | 4r |
| FIG. 15 | 0 | 6r | 4r |

By referring to Table 1, it can be found that the pin arrangements of FIG. 6, FIG. 8 and FIG. 10 exhibit a reduced resistance value existing between the output source voltage pin vccq and the worst data pin, as compared to the conventional pin arrangement of FIG. 4. The pin arrangement of FIGS. 13 and 14 also exhibit a reduced resistance value, as compared to the conventional pin arrangement of FIG. 12. By virtue of such a reduced resistance, the data output speed and the noise characteristic exhibited upon outputting data are improved.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor memory device comprising:

a plurality of external data I/O pins respectively coupled to a corresponding plurality of internal data I/O pads, said plurality of external data I/O pins and internal data I/O pads being divided into M data I/O pin groups and M data I/O pad groups, respectively, where M is a positive integer, wherein, each data I/O pin group and data I/O pad group comprises N external data I/O pins and N internal data I/O pads, respectively, where N is a positive integer; and M pairs of external first and second output power pins respectively coupled to M pairs of internal first and second output power pads to provide for separately powered and thereby electrically decoupled M pairs of internal first and second output power pads, wherein each of said M pairs of external first and second output power pads respectively couples via respective internal data I/O circuitry and internal data I/O pads to said N external data I/O pins in a respective one of said M data I/O pin groups, and wherein, each one of said external first and second output power pins is disposed between neighboring external data I/O pins that are internally coupled to said external first and second output power pins.

2. The semiconductor memory device of claim 1 wherein said plurality of external data I/O pins comprise 16 pins, and wherein M and N equal to 4.

3. A semiconductor memory device comprising:

a first plurality of external data I/O pins electrically coupled to a first plurality of internal data I/O pads, respectively;

a second plurality of external I/O pins electrically coupled to a second plurality of internal data I/O pads, respectively;

first and second external power pins electrically coupled to first and second internal power pads, respectively, wherein said first external power pin is adapted to receive a voltage level higher than said second external power pin; and third and fourth external power pins electrically coupled to third and fourth internal power pads, respectively, wherein said third external power pin is adapted to receive a voltage level higher than said fourth external power pin;

wherein, said first and second external power pins electrically couple and supply power to a first plurality of internal I/O circuitry respectively coupled to said first plurality of internal data I/O pads, and said third and fourth external power pins electrically couple and supply power to a second plurality of internal I/O circuitry respectively coupled to said second plurality of internal data I/O pads.

whereby, power supplies to said first plurality of internal I/O circuitry are electrically decoupled from power supplies to said second plurality of internal I/O circuitry, and wherein, each one of said first and second external power pins is disposed between neighboring ones of said first plurality of external data I/O pins, and each one of said second and third external power pins is disposed between neighboring ones of said second plurality of external data I/O pins.

4. The semiconductor memory device of claim 3 wherein said first and third external output power pins are adapted to receive a positive power supply voltage, and said second and fourth external output power pin are adapted to received ground or negative power supply voltage.

5. A semiconductor memory device as in claim 3 further comprising:

a third plurality of external data I/O pins, electrically coupled to a third plurality of internal data I/O pads, respectively;

a fourth plurality of external data I/O pins electrically coupled to a fourth plurality of internal data I/O pads; and fifth and sixth external power pins electrically coupled to fifth and sixth internal power pads, respectively, wherein said fifth external power pin is adapted to receive a voltage level higher than said sixth external power pin; and seventh and eighth external power pins electrically coupled to seventh and eighth internal power pads, respectively, wherein said seventh external power pin is adapted to receive a voltage level higher than said eighth external power pin;

wherein, said fifth and sixth external power pins electrically couple and supply power to a third plurality of internal I/O circuitry respectively coupled to said third plurality of internal data I/O pads, and said seventh and eighth external power pins electrically couple and supply power to a fourth plurality of internal I/O circuitry respectively coupled to said fourth plurality of internal data I/O pads, whereby, power supplies to said first, second, third and fourth plurality of internal I/O circuitry are electrically decoupled from each other, and wherein, each one of said fifth and sixth external power pins is disposed between neighboring ones of said third plurality of external data I/O pins, and each one of said seventh and eighth external power pins is disposed between neighboring ones of said fourth plurality of external data I/O pins.

6. The semiconductor memory device of claim 5 wherein each of said first, second, third and fourth plurality of external data I/O pins comprises 4 external pins.

7. A semiconductor memory device comprising:

sixteen data I/O pins electrically coupled to sixteen data I/O pads, respectively, said sixteen data I/O pins being divided into four groups of four I/O pins each, each I/O pad being coupled to a respective I/O circuit;

four pairs of I/O power supply pins electrically coupled to four pairs of I/O power supply pads, respectively, each pair of I/O power supply pins separately supplying power to I/O circuits coupled to a respective one of said four groups of four I/O pads, to provide electrically decoupled power supplies for I/O circuitry coupled to each group of four I/O pads;

wherein, first and second pins in each one of said four pairs of I/O power supply pins is disposed between neighboring data I/O pins in a group of four that receive power from said, first and second pins.

* * * * *